(12) United States Patent
Harada (10) Patent No.: US 9,966,170 B2
(45) Date of Patent: May 8, 2018

(54) SHUNT RESISTOR

(71) Applicant: ROHM CO., LTD., Kyoto-shi, Kyoto (JP)

(72) Inventor: Kenichi Harada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 15/459,926

(22) Filed: Mar. 15, 2017

(65) Prior Publication Data

US 2017/0271055 A1  Sep. 21, 2017

(30) Foreign Application Priority Data

Mar. 18, 2016  (JP) ................................ 2016-055733

(51) Int. Cl.
H01C 7/00 (2006.01)
H01C 1/144 (2006.01)
G01R 15/14 (2006.01)

(52) U.S. Cl.
CPC ........... *H01C 1/144* (2013.01); *G01R 15/146* (2013.01)

(58) Field of Classification Search
CPC .............................. H01C 1/144; G01R 15/146
USPC .......................................................... 338/49
See application file for complete search history.

(56) References Cited

U.S. PATENT DOCUMENTS

| | | | | |
|---|---|---|---|---|
| 5,214,407 A * | 5/1993 | McKim, Jr. | ............ | G01R 1/203 338/120 |
| 7,190,252 B2 * | 3/2007 | Smith | .................... | H01C 1/084 338/22 R |
| 7,911,319 B2 * | 3/2011 | Smith | .................... | H01C 1/148 29/610.1 |
| 8,031,043 B2 * | 10/2011 | Schultz | .................. | H01C 1/014 338/254 |
| 8,871,049 B2 * | 10/2014 | Lo | .......................... | H01C 1/144 156/272.8 |
| 9,384,876 B2 * | 7/2016 | Tsukada | ............... | H01C 17/242 |
| 2003/0146077 A1 * | 8/2003 | Enomoto | ............... | G01R 1/203 200/61.53 |
| 2004/0263150 A1 * | 12/2004 | Hetzler | ................. | G01R 1/203 324/126 |
| 2005/0200451 A1 * | 9/2005 | Tsukada | ................... | H01C 7/06 338/309 |
| 2005/0258930 A1 * | 11/2005 | Ishida | .................... | H01C 1/144 338/309 |
| 2009/0174522 A1 * | 7/2009 | Schulz | ................... | G01R 1/203 338/49 |
| 2010/0237982 A1 * | 9/2010 | Brackhan | ............... | H01C 1/084 338/308 |

(Continued)

FOREIGN PATENT DOCUMENTS

JP  2007-141909 A  6/2007

*Primary Examiner* — Kyung Lee
(74) *Attorney, Agent, or Firm* — Hamre, Schumann, Mueller & Larson, P.C.

(57) ABSTRACT

A shunt resistor includes a resistive body and a pair of electrodes each bonded to the resistive body. The resistive body has an obverse surface and a reverse surface that face in mutually opposite directions. The two electrodes are separate from each other in a first direction perpendicular to the thickness direction of the resistive body. The resistive body has two ends separate from each other in the first direction. The obverse surface of the resistive body includes a pair of intentionally curved portions that are located at the two ends of the resistive body.

28 Claims, 9 Drawing Sheets

(56) References Cited

U.S. PATENT DOCUMENTS

| | | | |
|---|---|---|---|
| 2013/0181807 A1* | 7/2013 | Hetzler | G01R 1/203 338/7 |
| 2014/0015636 A1* | 1/2014 | Tanaka | G01R 1/203 338/329 |
| 2014/0247108 A1* | 9/2014 | Tsukada | H01C 17/242 338/307 |
| 2016/0240288 A1* | 8/2016 | Chiku | H01C 1/04 |

* cited by examiner

SHUNT RESISTOR

FIELD

The present disclosure relates to shunt resistors used for current detection.

BACKGROUND

As known in the art, shunt resistors maybe used for current detection in various electronics. The resistance of a shunt resistor is in the range of 0.2-3.0 mΩ, for example.

A conventional shunt resistor may include a resistive body, a pair of electrodes attached to the opposite ends of the resistive body, and a protective film covering the resistive body. Each electrode is bonded to the resistive body by welding, for example, and its thickness is greater than that of the resistive body.

With the conventional shunt resistor described above, a welding defect such as blowholes maybe produced in the connection between the resistive body and each electrode. Unfavorably, the conventional structure of the shunt resistor makes it difficult to detect such defects, in particular through external visual inspection.

SUMMARY

In view of the above circumstances, an object of the present disclosure is to propose a solution for overcoming the above problem and to provide a highly reliable shunt resistor in which electrodes are properly bonded to a resistive body.

According to an embodiment, there is provided a shunt resistor including: a resistive body provided with a resistive-body obverse surface and a resistive-body reverse surface that face in mutually opposite directions; and a pair of electrodes that are separate from each other in a first direction and attached to the resistive body, where the first direction is perpendicular to the thickness direction of the resistive body. The resistive body includes two ends that are separate from each other in the first direction, and the resistive-body obverse surface includes a pair of resistive-body obverse curved surface portions that are located at the two ends of the resistive body.

Other features and advantages of the present disclosure will become apparent from the detailed description given below with reference to the accompanying drawings.

DESCRIPTION OF THE PREFERRED EMBODIMENTS

Preferred embodiments are described below with reference to the drawings.

A shunt resistor A10 according to a first embodiment, with reference to FIGS. 1 to 7. The shunt resistor A10 includes a resistive body 1 and a pair of electrodes 2.

Figure 1:
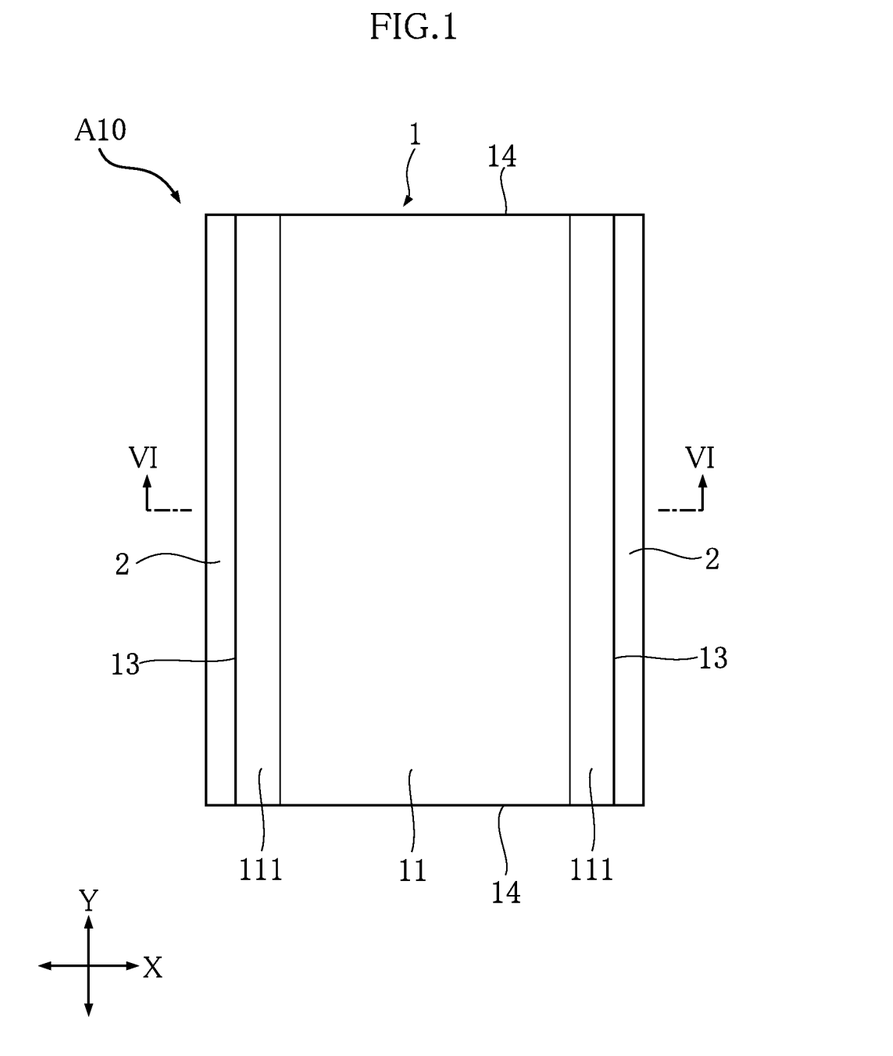
FIG. 1 is a plan view of a shunt resistor according to a first embodiment.
Figure 2:
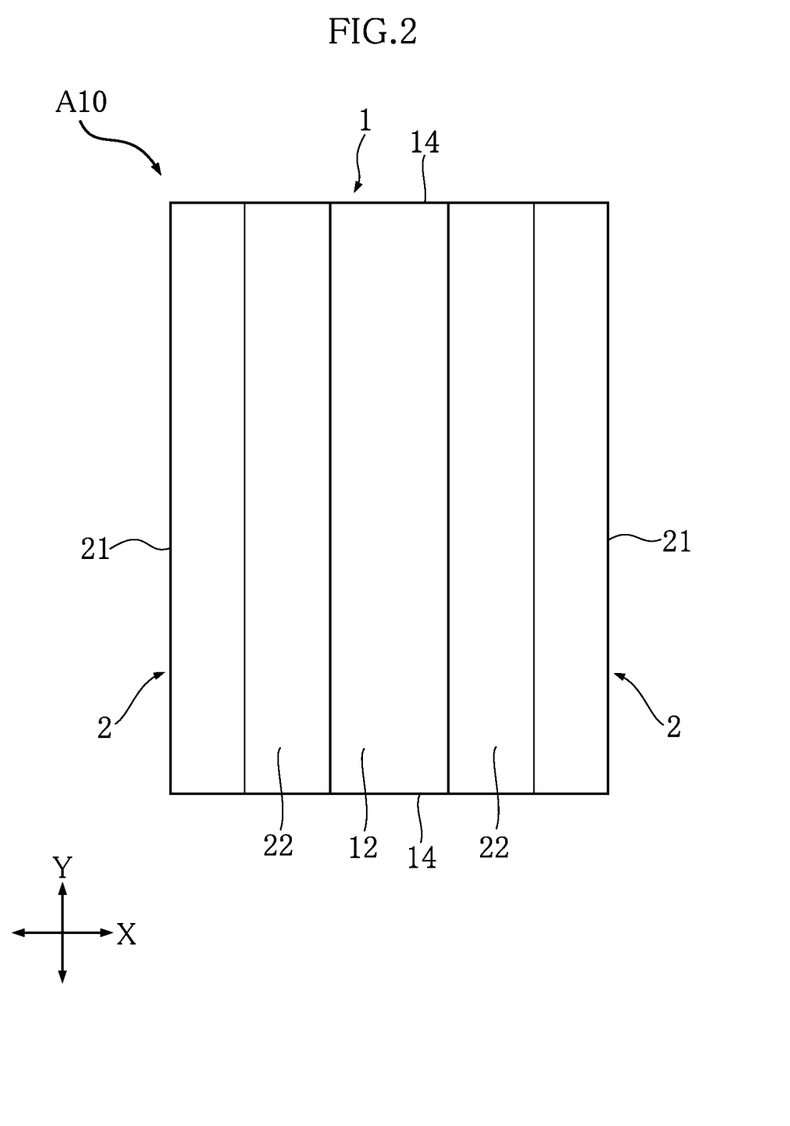
FIG. 2 is a bottom view of the shunt resistor.
Figure 3:
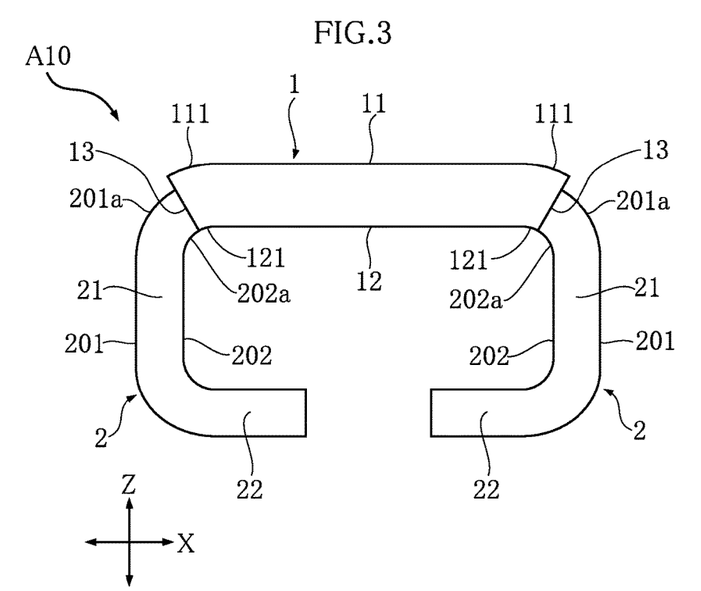
FIG. 3 is a front view of the shunt resistor.
Figure 4:
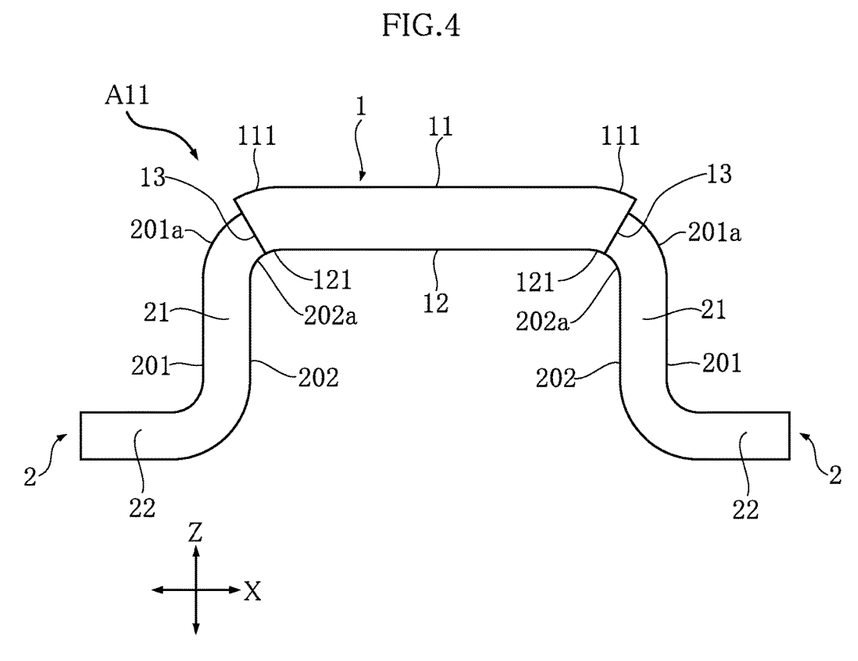
FIG. 4 is a front view of a variation of the shunt resistor.
Figure 5:
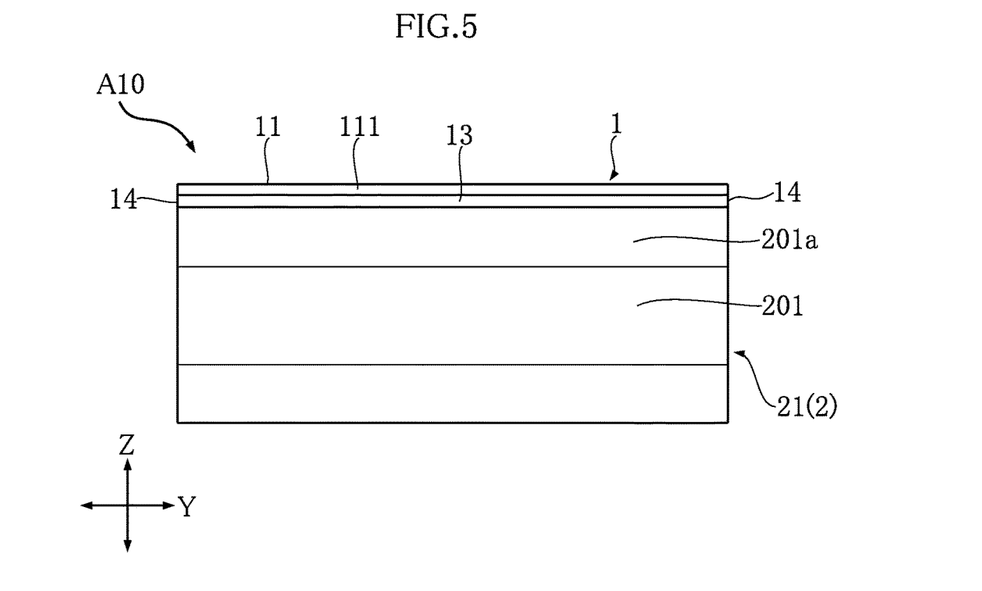
FIG. 5 is a side view of the shunt resistor shown in FIG. 1.
Figure 6:
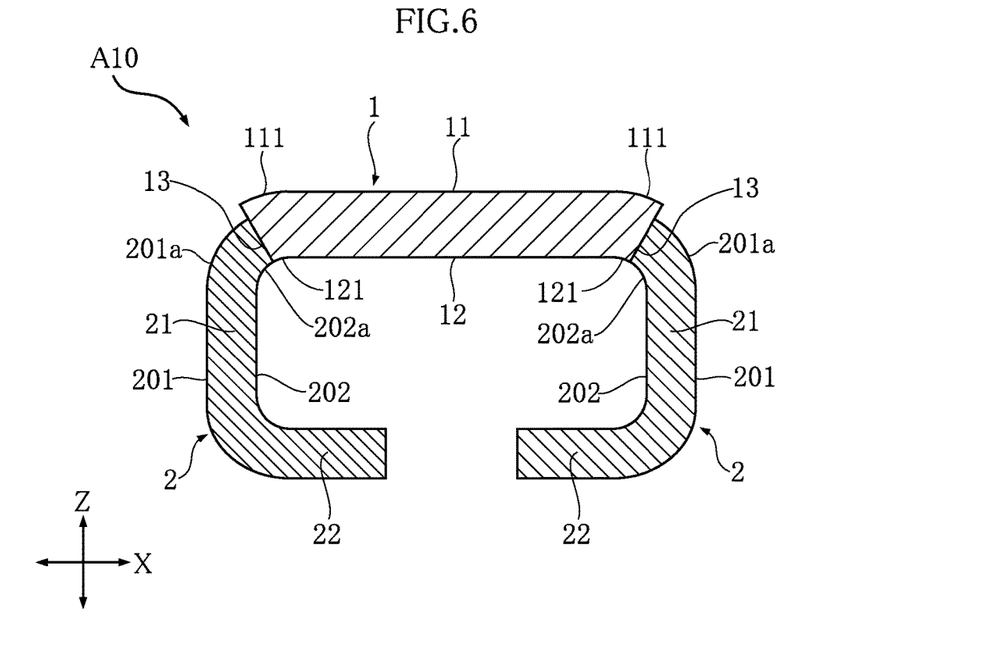
FIG. 6 is a cross-sectional view taken along line VI-VI of FIG. 1.
Figure 7:
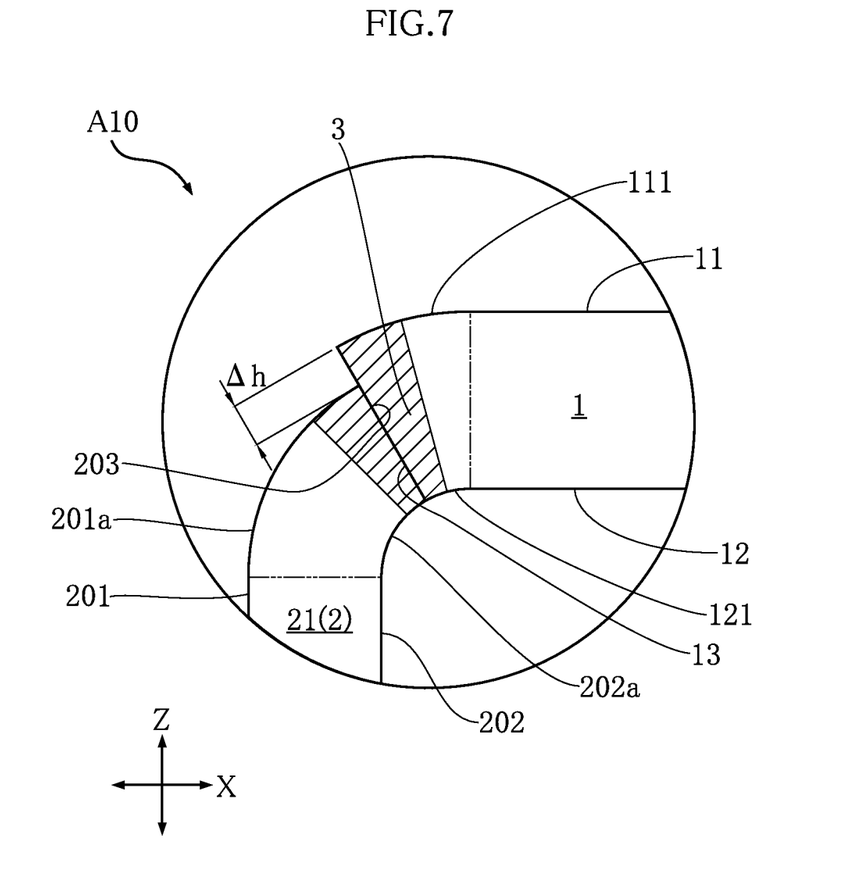
FIG. 7 is a partially enlarged view of FIG. 3.

FIG. 1 is a plan view of the shunt resistor A10. FIG. 2 is a bottom view of the shunt resistor A10. FIG. 3 is a front view of the shunt resistor A10. FIG. 4 is a front view of a shunt resistor A11, which is a variation of the shunt resistor A10. FIG. 5 is a side view of the shunt resistor A10. FIG. 6 is a cross-sectional view taken along line VI-VI of FIG. 1. FIG. 7 is a partially enlarged view of FIG. 3.

The shunt resistor A10 is surface-mountable on a circuit board, for example. For convenience of explanation, the horizontal direction in the plan view (FIG. 1) is referred to as a first direction X (which is perpendicular to the thickness direction Z of the resistive body 1), and the vertical direction is referred to as a second direction Y (which is perpendicular to both the thickness direction Z and the first direction X). As shown in FIG. 1, the shunt resistor A10 is rectangular in plan view. The shunt resistor A10 has a resistance in the range of 0.5-1.0 mΩ, for example.

The resistive body 1 is a passive element that primarily functions to detect current. As shown in FIGS. 1 and 2, the resistive body 1 has a rectangular shape elongated in the second direction Y. The pair of electrodes 2 are bonded, respectively, to the opposite ends of the resistive body 1 in the first direction X. The resistive body 1 may be provided by a metal plate made of a Ni—Cr alloy, a Cu—Mn alloy, a Cu—Ni alloy, a Cu—Mn—Sn alloy, or an Fe—Cr alloy, though the material of the resistive body 1 is not limited to these. Further, the resistive body 1 has a thickness of 0.4 mm, for example, though the thickness of the resistive body 1 is not limited to this. The resistive body 1 has a resistive-body obverse surface 11, a resistive-body reverse surface 12, a pair of resistive-body first side surfaces 13, and a pair of resistive-body second side surfaces 14.

As shown in FIG. 3, the resistive-body obverse surface 11 faces outwards of the shunt resistor A10. The resistive-body obverse surface 11 has a pair of resistive-body obverse curved surface portions 111, which are located at opposite ends in the first direction X. As shown in FIGS. 3 and 7, the pair of resistive-body obverse curved surface portions 111 protrude outwards of the shunt resistor A10. The portion of the surface 11 other than the pair of resistive-body obverse curved surface portions 111 constitutes a flat surface perpendicular to the thickness direction Z.

As shown in FIG. 3, the resistive-body reverse surface 12 faces in the opposite direction to the resistive-body obverse surface 11 in the thickness direction Z. The resistive-body reverse surface 12 has a pair of resistive-body reverse curved surface portions 121, which are located at opposite ends in the first direction X. As shown in FIGS. 3 and 7, a pair of resistive-body reverse curved surface portions 121 protrude outwards of the shunt resistor A10, like the pair of resistive-body obverse curved surface portions 111. The portion of the resistive-body reverse surface 12 other than the pair of resistive-body reverse curved surface portions 121 constitutes a flat surface perpendicular to the thickness direction Z.

As shown in FIGS. 1 and 3, a pair of resistive-body first side surfaces 13 are separate from each other in the first direction X, and intersect with both the resistive-body obverse surface 11 and the resistive-body reverse surface 12. In the present embodiment, the pair of electrodes 2 are bonded to the pair of resistive-body first side surfaces 13. As shown in FIGS. 1, 2, and 5, the pair of resistive-body second side surfaces 14 are separate from each other in the second direction Y, and intersect with both the resistive-body obverse surface 11 and the resistive-body reverse surface 12. Both ends of each resistive-body second side surface 14 in the first direction X are connected to the pair of resistive-body first side surfaces 13. The pair of resistive-body second side surfaces 14 are exposed to the outside of the shunt resistor A10.

As shown in FIGS. 1 to 3, the pair of electrodes 2 are terminals of the shunt resistor A10, which are separate from each other in the first direction X and bonded to opposite ends of the resistive body 1. In the present embodiment, the electrodes 2 are metal plates made of an alloy that contains Cu as primary component. Note that the electrodes 2 may be made of other materials as long as they are metal and have a lower electric resistivity than the resistive body 1. In addition, although the electrodes 2 have a thickness of 0.3 mm in the present embodiment, the electrodes 2 may have a different thickness as long as the electrodes 2 are thinner than the resistive body 1. The pair of electrodes 2 are bonded to the resistive body 1 by welding. In the present embodiment, the type of the aforementioned welding is laser welding. Each electrode 2 has an electrode obverse surface 201 and an electrode reverse surface 202. Also, each electrode 2 includes an upright portion 21 and a terminal portion 22.

As shown in FIG. 3, the electrode obverse surfaces 201 face outwards of the shunt resistor A10 in the same manner as the resistive-body obverse surface 11. Each electrode obverse surface 201 has an electrode obverse curved surface portion 201a, which is located at an end connected to the resistive body 1. As shown in FIGS. 3 and 7, the electrode obverse curved surface portions 201a protrude outwards of the shunt resistor A10. In the present embodiment, steps Δh are formed between the resistive-body obverse curved surface portions 111 and the electrode obverse curved surface portions 201a. The steps Δh have a uniform height in the second direction Y.

As shown in FIG. 3, the electrode reverse surfaces 202 face in the opposite direction to the electrode obverse surfaces 201. Each electrode reverse surface 202 has an electrode reverse curved surface portion 202a, which is located at an end connected to the resistive body 1. As shown in FIGS. 3 and 7, the electrode reverse curved surface portions 202a protrude outwards of the shunt resistor A10, along with the electrode obverse curved surface portions 201a. In the present embodiment, the resistive-body reverse curved surface portions 121 are flush with the electrode reverse curved surface portions 202a.

As shown in FIG. 7, the shunt resistor A10 is formed with bonded areas 3 (one of which is shown as a shaded portion in FIG. 7). Each bonded area 3 includes parts of the resistive body 1 and the electrode 2 and is sandwiched between the resistive-body obverse curved surface portion 111 and the resistive-body reverse curved surface portion 121 and between the electrode obverse curved surface portion 201a and the electrode reverse curved surface portion 202a. The bonded areas 3 are welding heat-affected portions created by: bonding the electrodes 2 to the resistive body 1 by welding; and then bending the resultant bonded area intentionally. In FIG. 7, the section from the resistive-body first side surface 13 of the resistive body 1 to an imaginary line (two-dot chain line) drawn on the resistive body 1 includes the resistive-body obverse curved surface portion 111 and the resistive-body reverse curved surface portion 121 of the resistive body 1. Similarly, in FIG. 7, the section from an electrode end surface 203 of the electrode 2 connecting to the resistive-body first side surface 13 to an imaginary line drawn on the electrode 2 includes the electrode obverse curved surface portion 201a and the electrode reverse curved surface portion 202a of the electrode 2.

As shown in FIGS. 3 and 5, upright portions 21 are bonded to the resistive body 1 at first ends, and extend in the thickness direction Z. The first ends include the electrode obverse curved surface portions 201a and the electrode reverse curved surface portions 202a as their structural elements. As shown in FIGS. 2 and 3, the terminal portions 22 are connected to second ends of the upright portions 21, which are located opposite to the first ends in the thickness direction Z, and extend along the first direction X. The terminal portions 22 connect the electrodes 2 to a mounting circuit board.

As shown in FIG. 3, the terminal portions 22 extend so as to approach each other in the first direction X. On the other hand, in the shunt resistor A11 in FIG. 4, which is a variation of the shunt resistor A10, the terminal portions 22 extend so as to be away from each other in the first direction X (i.e., the direction opposite to the direction in which the terminal portions 22 of the shunt resistor A10 extend).

As shown in FIGS. 1-3 and FIG. 6, the cross-sectional shapes of the shunt resistor A10 relative to the second direction Y are uniform.

The following describes advantageous effects of the shunt resistor A10.

The shunt resistor A10 includes the resistive body 1, which has the obverse surface 11 that faces outwards, and further includes the pair of electrodes, which are separate from each other in the first direction X and bonded to the opposite ends of the resistive body 1. The resistive-body obverse surface 11 has the pair of resistive-body obverse curved surface portions 111 located at opposite ends in the first direction X. As shown in FIG. 7, the pair of resistive-body obverse curved surface portions 111 are formed by bending the bonded areas 3, which are welding heat-affected portions and include parts of the resistive body 1 and the electrodes 2. Accordingly, the bonded areas 3 are subjected to bending stress, and if the bonded areas 3 have any defects, a failure such as a crack or a rupture may occur in the bonded areas 3. This makes it possible to detect, if any, a defect in the bonded areas 3 through external visual inspection, and to appropriately remove the shunt resistor A10 with the defective bonding areas 3. As such, a shunt resistor A10 unremoved has high reliability where the resistive body 1 and the electrodes 2 are properly bonded to each other.

Also, the electrodes 2 have electrode obverse surfaces 201 that face outwards. The electrode obverse surfaces 201 have electrode obverse curved surface portions 201a which are each located at an end connected to the resistive body 1. Each of the electrode obverse curved surface portions 201a is formed by bending a part of the bonded area 3 located toward the electrode 2 from the electrode end surface 203, as well as a part of the bonded area 3 located toward the resistive body 1 from the resistive-body first side surface 13, as shown in FIG. 7. In this way, bending stress is applied uniformly on the bonded areas 3 to thereby improve the detection accuracy of a defect in the bonded areas 3 through external visual inspection.

The electrodes 2 include the upright portions 21 and the terminal portions 22. The upright portions 21 are bonded to the resistive body 1 at first ends and extend in the thickness direction Z. The terminal portions 22 are connected to the other ends of the upright portions 21 and extend in the first direction X. When the shunt resistor A10 is surface-mounted on a mounting circuit board, cream solder is generally used, which is melted in a reflow furnace. The upright portions 21 utilize the surface tension of the melted cream solder to facilitate the formation of a solder fillet. Also, the combination of the upright portions 21 and the terminal portions ensures a sufficient contact area between the electrodes 2 and the circuit board of the shunt resistor A10. Furthermore, the upright portions 21 and the terminal portions 22 are effective in blocking the melted cream solder, and therefore can prevent electrical shorting of the pair of electrodes 2 caused by the adherence of the melted cream solder.

The following describes a second embodiment, with reference to FIGS. 8 to 13. In these figures, elements that are the same as or similar to the aforementioned shunt resistor A10 are provided with the same reference signs, and descriptions thereof are omitted.

Figure 8:
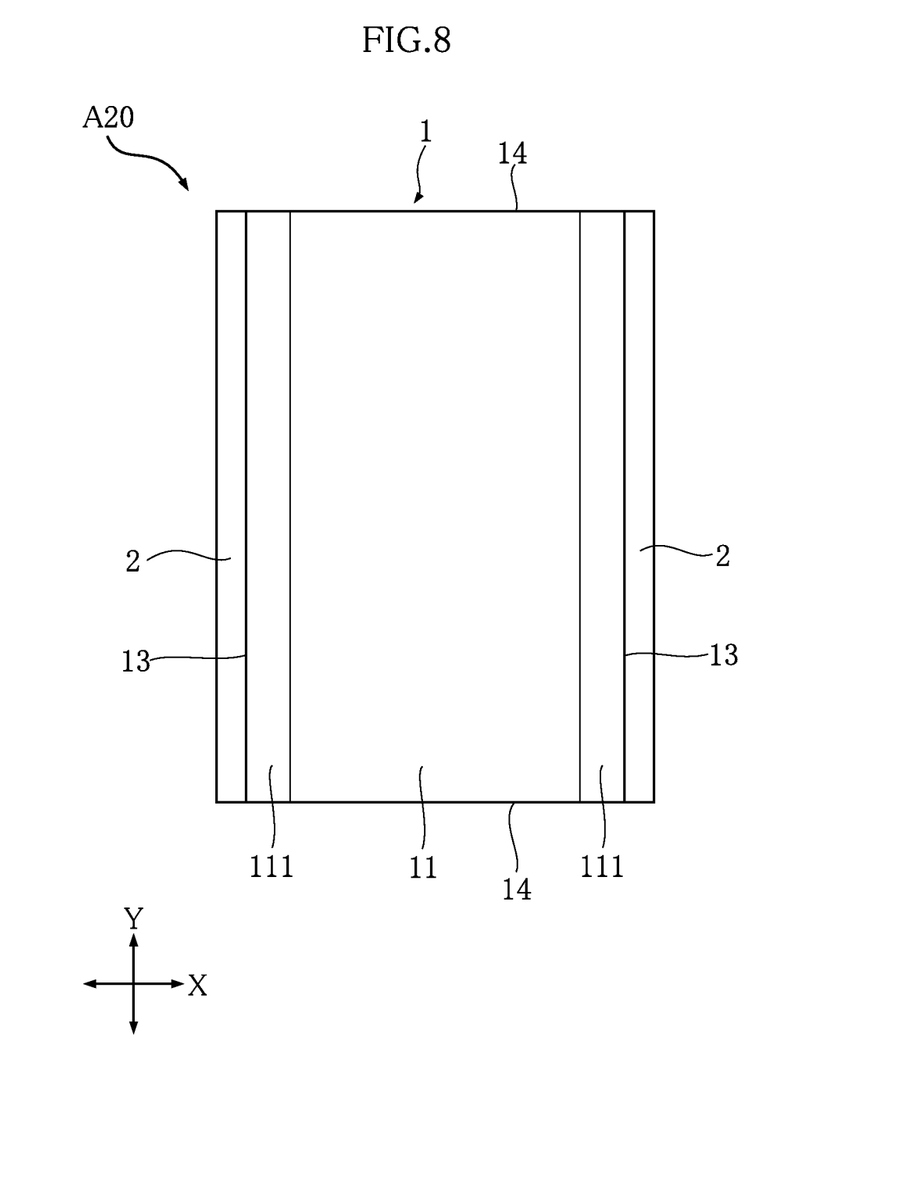
FIG. 8 is a plan view of a shunt resistor according to a second embodiment.
Figure 9:
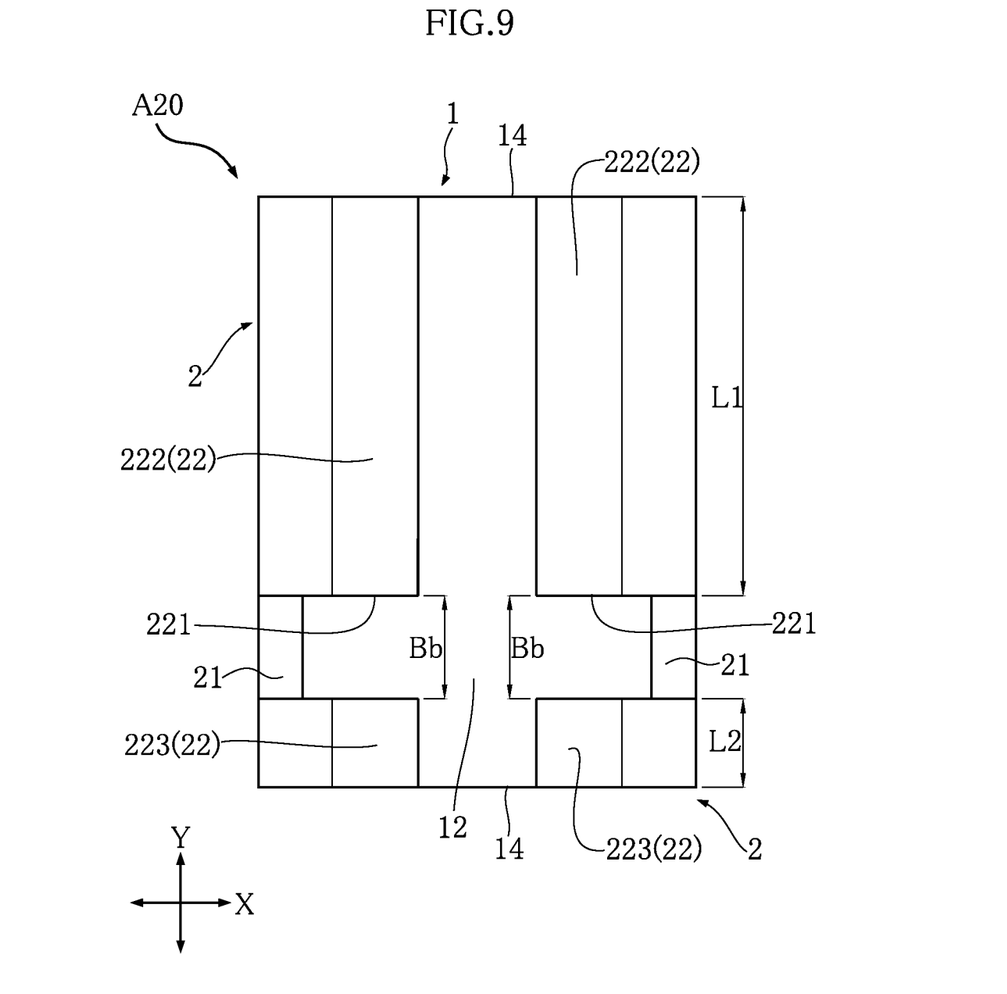
FIG. 9 is a bottom view of the shunt resistor shown in FIG. 8.
Figure 10:
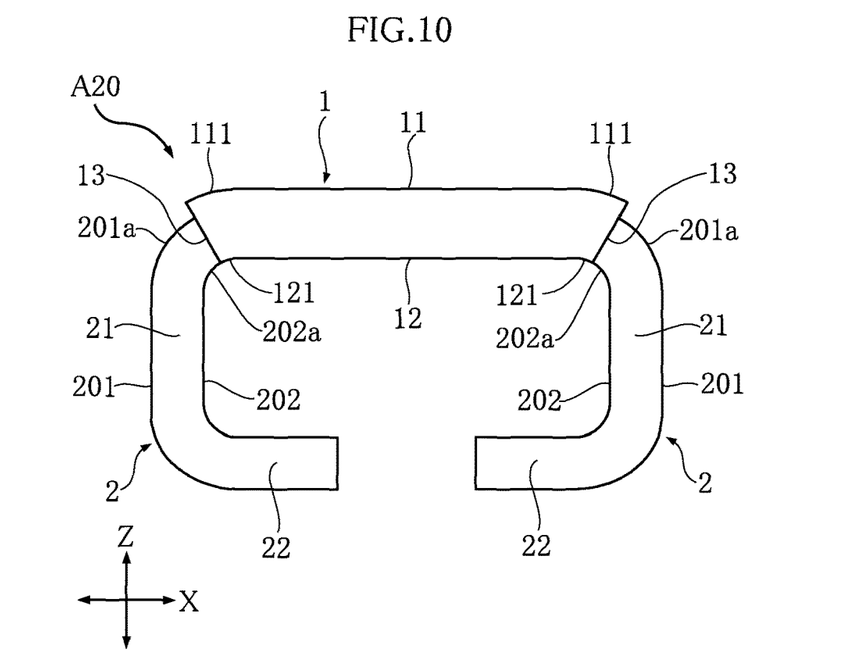
FIG. 10 is a front view of the shunt resistor shown in FIG. 8.
Figure 11:
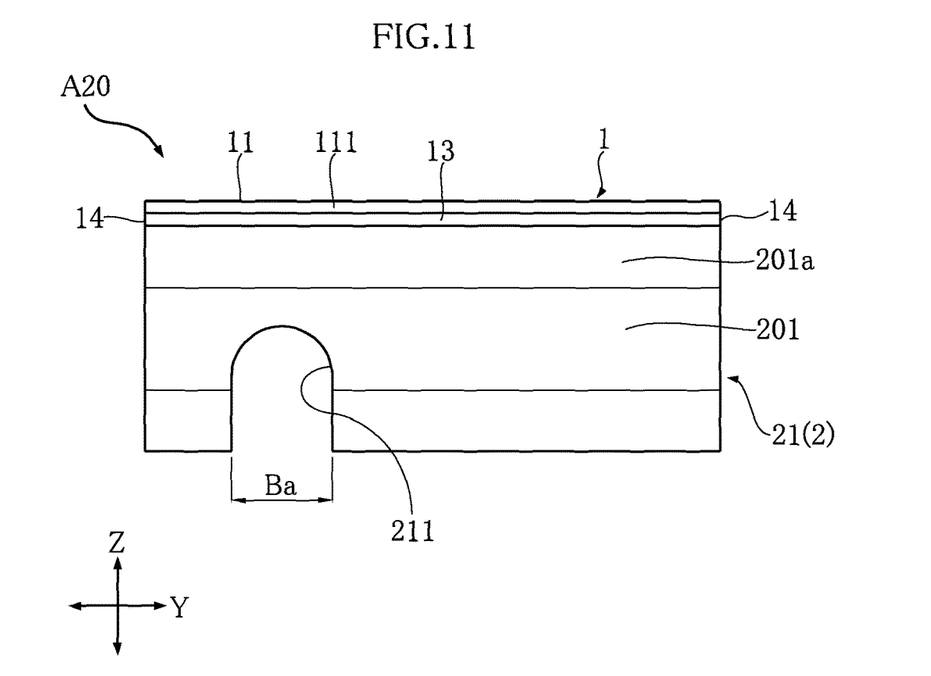
FIG. 11 is a right side view of the shunt resistor shown in FIG. 8.
Figure 12:
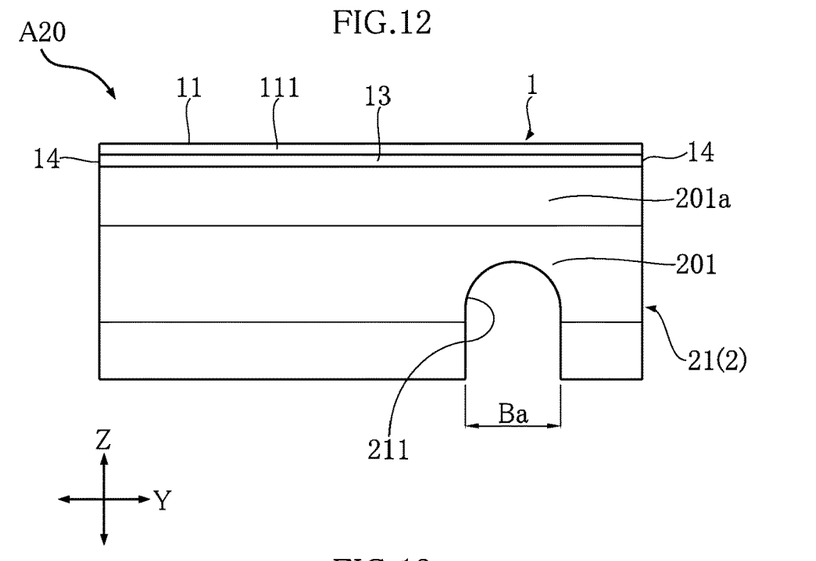
FIG. 12 is a left side view of the shunt resistor shown in FIG. 8.
Figure 13:
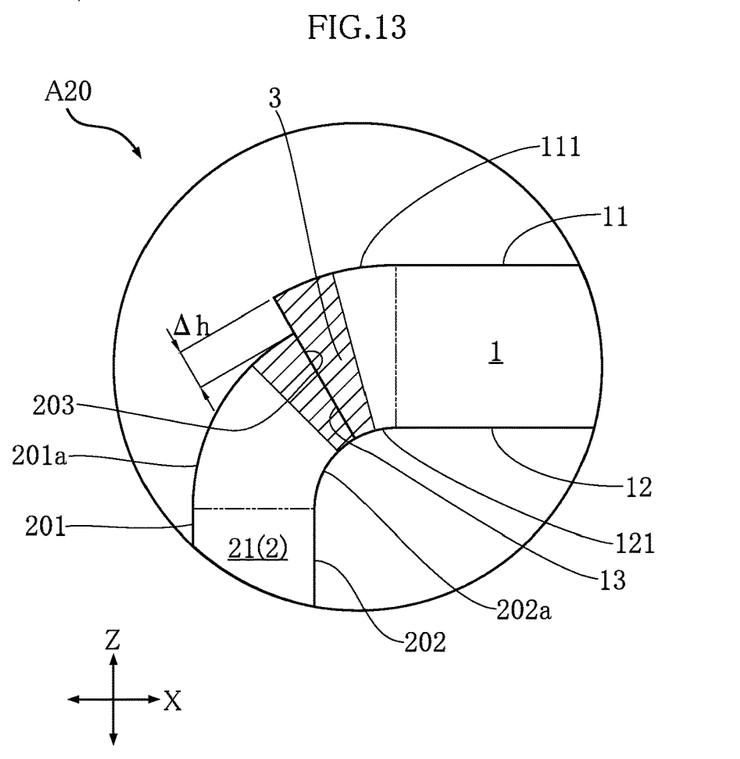
FIG. 13 is a partially enlarged view of FIG. 10.

FIG. 8 is a plan view of a shunt resistor A20. FIG. 9 is a bottom view of the shunt resistor A20. FIG. 10 is a front view of the shunt resistor A20. FIG. 11 is a right side view of the shunt resistor A20. FIG. 12 is a left side view of the shunt resistor A20. FIG. 13 is a partially enlarged view of FIG. 10. As shown in FIG. 8, the shunt resistor A20 according to the present embodiment is rectangular as seen in plan view.

The shunt resistor A20 differs from the shunt resistor A10 in the structure of the pair of electrodes 2.

As shown in FIGS. 9 to 12, the terminal portions 22 of the electrodes 2 are formed with terminal-portion through grooves 221. The terminal-portion through grooves 221 are continuous from the electrode obverse surface 201 to the electrode reverse surface 202 and extend along the first direction X. The terminal portions 22 are divided by the terminal-portion through grooves 221 into first terminal portions 222 and second terminal portions 223 that are separate from each other in the second direction Y. As shown in FIG. 9, the length L1 of the first terminal portions 222 is greater than the length L2 of the first terminal portions 222 in the second direction Y.

As shown in FIGS. 9 to 12, the upright portions 21 of the electrodes 2 are formed with upright-portion through grooves 211. The upright-portion through grooves 211 are connected to the terminal-portion through grooves 221, continuous from the electrode obverse surface 201 to the electrode reverse surface 202, and extend along the thickness direction Z. The upright-portion through grooves 211 are formed in parts of the upright portions 21 and do not completely divide the upright portions 21. Also, as shown in FIGS. 9, 11, and 12, the width Ba of the terminal-portion through grooves 221 equals to the width Bb of the upright-portion through grooves 211.

As shown in FIG. 13, the bonded areas 3 of the shunt resistor A20 have the same structure as the bonded areas 3 of the shunt resistor A10.

The following describes advantageous effects of the shunt resistor A20.

Similarly to the shunt resistor A10, the shunt resistor A20 includes the resistive body 1, which has the obverse surface 11 that faces outwards, and further includes the pair of electrodes, which are separate from each other in the first direction X and bonded to the opposite ends of the resistive body 1. The resistive-body obverse surface 11 has the pair of resistive-body obverse curved surface portions 111 located at the opposite ends in the first direction X. As such, the shunt resistor A20 also has high reliability where the resistive body 1 and the electrodes 2 are properly bonded to each other.

The electrodes 2 of the second embodiment are formed with the upright-portion through grooves 211 and the terminal-portion through grooves 221, where the terminal-portion through grooves 221 divide the terminal portions 22 into the first terminal portions 222 and the second terminal portions 223 (in total four terminal portions). With such an arrangement, the shunt resistor A20 can be used for providing more than one (current/voltage) detection system.

The present disclosure is not limited to the above embodiments. Various design changes can be made to the specific configurations of the elements of the present disclosure.

The invention claimed is:

1. A shunt resistor, comprising:
   a resistive body including a resistive-body obverse surface and a resistive-body reverse surface that face in mutually opposite directions; and
   a pair of electrodes that are separate from each other in a first direction and bonded to the resistive body, the first direction being perpendicular to a thickness direction of the resistive body,
   wherein the resistive body includes two ends that are separate from each other in the first direction,
   the resistive-body obverse surface includes a pair of resistive-body obverse curved surface portions that are located at the two ends of the resistive body and also includes an obverse surface intermediate portion between the pair of resistive-body obverse curved surface portions, and
   the resistive body includes a pair of resistive-body side surfaces that are separate from each other in the first direction and that intersect with both the resistive-body obverse surface and the resistive-body reverse surface, and each of the pair of electrodes is bonded to a part of a corresponding one of the resistive-body side surfaces in a manner such that a remaining part of the corresponding one of the resistive-body side surfaces other than said part is exposed.

2. The shunt resistor of claim 1, wherein each of the resistive body and the pair of electrodes is made of a metal.

3. The shunt resistor of claim 2, wherein the resistive body is made of one of a Ni—Cr alloy, a Cu—Mn alloy, a Cu—Ni alloy, a Cu—Mn—Sn alloy or an Fe—Cr alloy.

4. The shunt resistor of claim 2, wherein the pair of electrodes are made of an alloy containing Cu.

5. The shunt resistor of claim 2, wherein the pair of electrodes are bonded to the resistive body by welding.

6. The shunt resistor of claim 5, wherein the welding is laser welding.

7. The shunt resistor of claim 1, wherein the resistive-body reverse surface includes a pair of resistive-body reverse curved surface portions located at the two ends of the resistive body, respectively.

8. The shunt resistor of claim 7, wherein the pair of resistive-body obverse curved surface portions and the pair of resistive-body reverse curved surface portions protrude outwards.

9. The shunt resistor of claim 7, wherein each of the pair of electrodes includes an electrode obverse surface and an electrode reverse surface that face in mutually opposite directions, and the electrode obverse surface includes an electrode obverse curved surface portion located at an end connected to the resistive body.

10. The shunt resistor of claim 9, wherein the electrode reverse surface of each electrode includes an electrode reverse curved surface portion opposite to the electrode obverse curved surface.

11. The shunt resistor of claim 10, wherein in each electrode, the electrode obverse curved surface portion and the electrode reverse curved surface portion protrude outwards.

12. The shunt resistor of claim 10, wherein the electrode reverse curved surface portion of each electrode is flush with a corresponding one of the resistive-body reverse curved surface portions.

13. The shunt resistor of claim 9, wherein the electrode obverse curved surface portion of each electrode is not flush with a corresponding one of the resistive-body obverse curved surface portions.

14. The shunt resistor of claim 1, wherein each of the electrodes is thinner than the resistive body.

15. The shunt resistor of claim 1, wherein each of the electrodes includes an upright portion, a terminal portion and an intermediate portion, the upright portion being connected at an end thereof to the resistive body and extending in the thickness direction of the resistive body, the terminal portion extending along the first direction, the intermediate portion being disposed between the upright portion and the terminal portion and curved.

16. The shunt resistor of claim 15, wherein the terminal portions of the respective electrodes extend so as to be away from each other.

17. The shunt resistor of claim 15, wherein the terminal portions of the respective electrodes extend so as to approach each other.

18. The shunt resistor of claim 15, wherein each of the terminal portions is formed with a terminal-portion through groove extending along the first direction, and said each of the terminal portions is divided by the terminal-portion through groove into a first terminal portion and a second terminal portion that are separate from each other.

19. The shunt resistor of claim 18, wherein the first terminal portion is longer than the second terminal portion in a second direction perpendicular to both the thickness direction of the resistive body and the first direction.

20. The shunt resistor of claim 18, wherein each of the upright portions is formed with an upright-portion through groove that is connected to the terminal-portion through groove and extends along the thickness direction of the resistive body.

21. The shunt resistor of claim 20, wherein in each electrode, the terminal-portion through groove is equal in width to the upright-portion through groove.

22. The shunt resistor of claim 1, wherein each of the resistive-body side surfaces is nonparallel to the thickness direction.

23. The shunt resistor of claim 1, wherein each of the resistive-body obverse curved surface portions has an end that is offset toward the resistive-body reverse surface from the obverse surface intermediate portion in the thickness direction.

24. The shunt resistor of claim 1, wherein the resistive-body reverse surface has two reverse surface ends spaced apart from each other in the first direction, the resistive-body obverse curved surface portions respectively have two curved portion ends spaced apart from each other in the first direction, and the two reverse surface ends are located between the two curved portion ends in the first direction.

25. The shunt resistor of claim 1, wherein the resistive-body obverse surface is greater in length measured in the first direction than the resistive-body reverse surface.

26. The shunt resistor of claim 1, wherein the resistive-body reverse surface includes two reverse surface end portions spaced apart from each other in the first direction and also includes a reverse surface intermediate portion between the two reverse surface end portions, and each of the two reverse surface end portions is offset away from the resistive-body obverse surface with respect to the reverse surface intermediate portion in the thickness direction.

27. The shunt resistor of claim 1, wherein the resistive-body reverse surface includes two reverse surface end portions spaced apart from each other in the first direction, the pair of electrodes respectively include two electrode end faces arranged to face each other via a gap, and the two electrode end faces are located between the two reverse surface end portions in the first direction.

28. The shunt resistor of claim 1, wherein a distance between the two reverse surface end portions is greater in the first direction than a distance between the two electrode end faces.

* * * * *